United States Patent [19]

Saleme

[11] 3,858,063

[45] Dec. 31, 1974

[54] TIMED LIGHT PULSE GENERATOR

[75] Inventor: Jose A. Saleme, Sunnyvale, Calif.

[73] Assignee: Redlake Corporation, Santa Clara, Calif.

[22] Filed: Apr. 2, 1973

[21] Appl. No.: 346,960

[52] U.S. Cl. .................. 307/311, 307/301, 331/111, 346/107 A

[51] Int. Cl. .......................................... H05b 37/00

[58] Field of Search ............. 346/23, 107 R, 107 A; 331/111; 307/311, 301; 179/100.3 Z

[56] References Cited

UNITED STATES PATENTS

| | | | |
|---|---|---|---|
| 3,173,107 | 3/1965 | Scharf et al. | 331/111 |
| 3,197,782 | 7/1965 | Williamson | 346/109 |
| 3,350,716 | 10/1967 | Trolio et al. | 346/23 |
| 3,514,622 | 5/1970 | Costa et al. | 331/111 X |
| 3,603,974 | 9/1971 | Copeland | 346/23 |

*Primary Examiner*—Joseph W. Hartary
*Attorney, Agent, or Firm*—Schapp and Hatch

[57] ABSTRACT

A time interval marker for a camera comprising a timing light generator having an oscillator circuit for generating a variable frequency timing pulse for energizing a light emitting diode to mark a continuously moving film strip at predetermined time intervals. The oscillator comprises a resistor-capacitor network coupled to a unijunction transistor which becomes conductive at periodic intervals determined by the RC constant of the resistor-capacitor network. The unijunction transistor is coupled to a transistor network which in turn is directly coupled to a light emitting diode so that when the unijunction transistor is conductive, the transistor is rendered conductive for inducing a current in the light emitting diode so as to focus a beam of light on a film strip and mark a timing pulse thereon.

1 Claim, 2 Drawing Figures

TIMED LIGHT PULSE GENERATOR

BACKGROUND OF THE INVENTION

The present invention relates to a time interval marker for a camera and more particularly to a timing light generator directly coupled to a light emitting diode for marking timing marks on a continuously moving photographic film at predetermined intervals.

Various timing circuits have been used to mark photographic film at intervals indicating the expiration of predetermined time periods of exposure between the markings. Such devices typically focus a light beam on the photographic film at the expiration of an internally adjustable time period to record the measurement of time between the markings. This time measurement is helpful in measuring the time intervals between exposure frames. Typical prior art devices have been unreliable, bulky and unadaptable to various different types of cameras.

SUMMARY OF THE INVENTION

The present invention provides a timing light generator for a camera which avoids the aforedescribed disadvantages. To achieve this, the invention provides a resistor-capacitor network having a variable resistor. The resistor capacitor network is connected to the emitter of a unijunction transistor so that when the capacitor charge up to a sufficient level to render the unijunction transistor conductive, the capacitor is discharged through the RC circuit. The unijunction transistor is in turn coupled to a transistor circuit to render it conductive when the unijunction transistor is conductive.

The transistor circuit is directly connected to a light emitting diode and induces a current in the light emitting diode when the transistor is conductive. The light emitting diode is positioned on the camera so that when it is conductive, it focuses a beam of light onto the photographic film through a rod lens and slit to make a timing mark on the film.

The variability of the resistor in the RC network is effective to vary the time interval during which the unijunction transistor is conductive and correspondingly the periodic conductivity of the light emitting diode. This adjustability permits variability of the time interval between markings on the film by the light emitting diode. The direct coupling of the light emitting diode to the transistor avoids the requirement of amplification of the light emitting diode inherent in the prior art and lends itself to miniaturization.

Accordingly an object of the present invention is to provide means to mark photographic film at predetermined time intervals.

Another object of the present invention is to provide a timing light generator for a camera for generating a timing light pulse.

Still another object of the present invention is to provide a variable frequency oscillator directly coupled to a light emitting diode for energizing the light emitting diode at intervals determined by the frequency of the oscillator.

Yet another object of the present invention is to provide a timing light generator directly coupled to a light emitting diode for rendering the diode conductive at periodic intervals determined by the timing light generator.

Other objects, advantages and novel features of the present invention will become apparent from the following detailed description of the invention when considered in conjunction with the accompanying drawings.

BRIEF DESCRIPTION OF THE DRAWINGS

The preferred form of the present invention is illustrated in the accompanying drawings, in which.

DESCRIPTION OF THE PREFERRED EMBODIMENT

Figure 1:
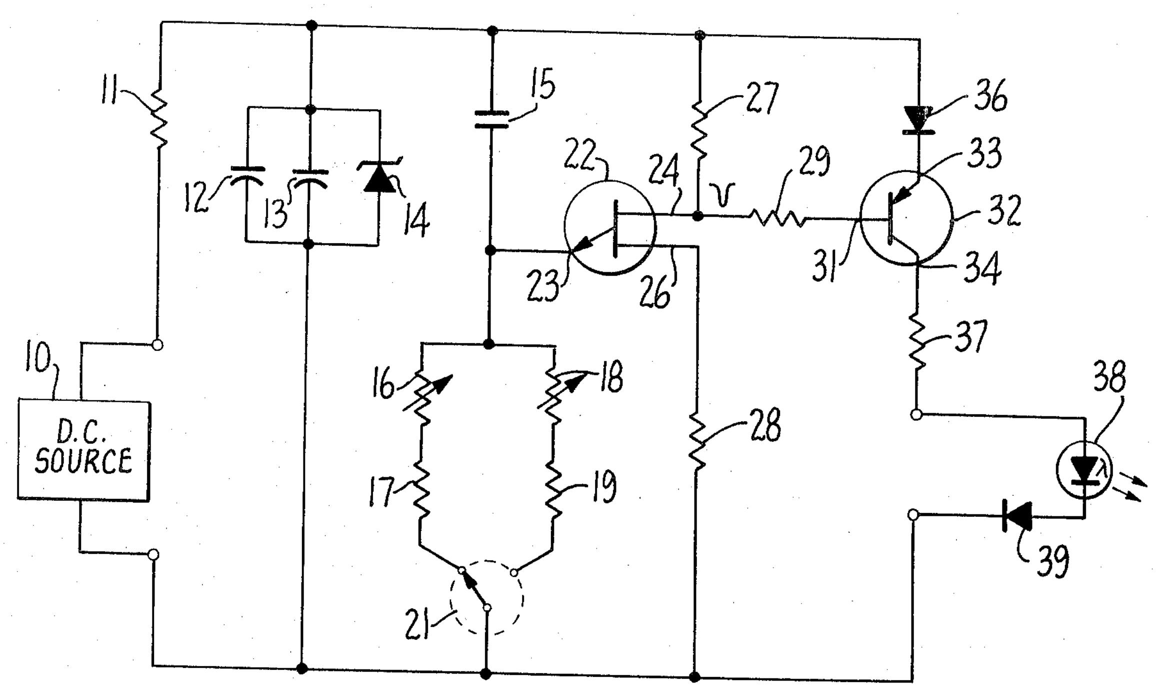
FIG. 1 is a schematic diagram of the circuit of the present invention.

Referring to FIG. 1, there is shown the timing light generator of the present invention directly coupled to a light emitting diode. The input to the timing light generator may be any standard DC input source 10 which is connected through a current limiting resistor 11 across a filter network. The filter network comprises capacitors 12 and 13 and zener diode 14 all coupled in parallel. The capacitors filter out unwanted a.c. signals from the power supply or any other disturbance in the circuit. The zener diode 14 sets the operating voltage for the capacitors 12 and 13 and breaks down at predetermined voltage levels to protect the circuit from overvoltage.

A resistor capacitor circuit having capacitor 15 in series with resistors 16, 17, 18 and 19 is coupled in parallel with the filter circuit. The time constant of the resistor capacitor circuit may be varied by a switch 21. The emitter electrode 23 of a unijunction transistor 22 having base electrodes 24 and 26 is connected to the resistor capacitor circuit between the capacitor 15 and the resistor network as shown. The capacitor 15 is charged up by the d.c. source 10. When the voltage across capacitor 15 reaches a sufficiently high level to render the emitter electrode 23 sufficiently negative with respect to base electrode 24, the unijunction transistor 22 breaks down and is conductive between base electrodes 24 and 26. A negative pulse is thereby generated at base electrode 24 due to a voltage drop across a resistor 27. The conductivity of unijunction transistor 22 causes a voltage drop across resistor 27 and a current limiting resistor 28 to cause the capacitor 15 to discharge.

After the unijunction transistor 22 becomes conductive, the capacitor 15 discharges in a relatively short period of time therethrough. This reduces the voltage at emitter electrodes 23 to a level at which unijunction transistor 22 is cut off. This cut off of the unijunction transistor causes capacitor 15 to charge up again according to the time constant determined by the setting of switch 21 as well as the adjustment of resistors 16 and 18 to begin the cycle again. Thus, it is seen that the periodic generation of negative pulses at base electrode 24 may be varied by the setting of the switch 21 and adjustment of resistors 16 and 18.

The negative pulse at base 24 is coupled through a resistor 29 to a base electrode 31 of a PNP transistor 32 having an emitter electrode 33 and a collector electrode 34. The saturation of transistor 32 causes the voltage between the base electrode 31 and the emitter electrode 33 to become sufficiently negative to cause conduction of the transistor 32. This conduction causes current to be passed through a diode 36 and through a resistor 37 via the electrodes 33 and 34 of the transistor 32. The current through resistor 37 is further passed through light emitting diode 38 and a diode 39.

Figure 2:
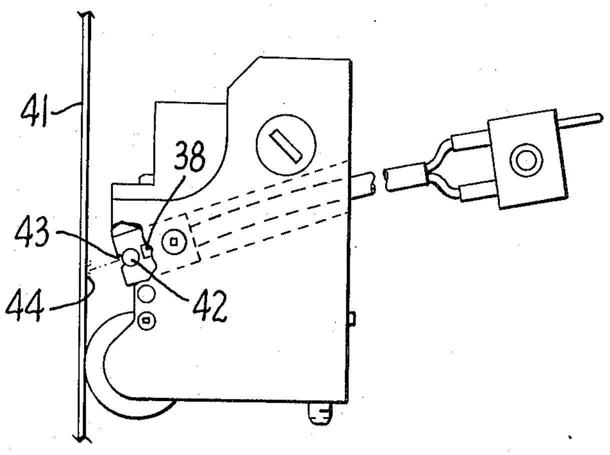
FIG. 2 is a diagram of the positioning of the light emitting diode on the camera.

Light emitting diode 38 generates a beam of light having an intensity proportional to the current therethrough. As shown in FIG. 2, the light beam is focused onto a film strip 41 through a rod lens 42 and a slit 43 to make a timing mark 44 on the film strip. Thus, it is seen that the periodic generation of negative pulses at base electrode 24 of unijunction transistor 23 determines the frequency of timing marks on film strip 41.

The diode 39 provides reverse voltage protection to the light emitting diode 38 in the event that the leads are mistakenly reversed. Since the light emitting diode 38 is rather sensitive, such reverse current would harm it. The diode 39 prevents any such harm.

Accordingly it is seen that the present invention provides a timing light generator having an oscillator circuit directly coupled to a light emitting diode. This avoids complex interface circuitry between the oscillator circuit and the light emitting diode inherent in typical prior art devices. The light emitting diode 38 of the present invention may be current driven by the conduction of transistor 32 and therefore does not require any amplification. The connection of the light emitting diode directly to the oscillator circuit in this manner permits the unit to be readily adaptable to several different types of cameras and lends itself to miniaturization. It further has greater reliability.

Obviously many modifications and variations of the present invention are possible in the light of the above teachings. It is therefore to be understood that within the scope of the appended claim, the invention may be practiced otherwise than as specifically described.

I claim:

1. A timed light pulse generator for use in marking photographic film with timing marks, comprising:

a pair of capacitors and a Zener diode connected in parallel as a filter network, said filter network being connected directly across a direct current source and a resistor connected in series;

an RC network connected directly across said filter network, said RC network consisting of a timing capacitor connected in series with a variable resistance network, said variable resistance network consisting of a pair of circuit branches each including a fixed resistor and a variable resistor and switch means for selectively connecting one or the other of said circuit branches to one terminal of said filter network, the ends of said circuit branches remote from said switch means being connected to a common circuit point to which one terminal of said timing capacitor is also connected;

a unijunction transistor, the emitter electrode of said unijunction transistor being directly connected to said common circuit point, and each base electrode of said unijunction transistor being connected to one terminal of said filter network through an associated resistor, the one of said base electrodes serving as an output electrode having its associated resistor directly coupled to a terminal of said timing capacitor; and a transistor, said transistor having its base electrode connected to said output electrode of said unijunction transistor through a resistor, having its emitter electrode connected through a diode to the terminal of said timing capacitor remote from said common circuit point, and having its collector electrode connected to the terminal of said variable resistance network remote from said common circuit point through a series-connected combination of a resistor, a diode, and a light-emitting diode.

* * * * *